United States Patent
Sato (10) Patent No.: US 8,310,288 B2
(45) Date of Patent: Nov. 13, 2012

(54) PLL CIRCUIT

(75) Inventor: Hajime Sato, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 70 days.

(21) Appl. No.: 13/028,815

(22) Filed: Feb. 16, 2011

(65) Prior Publication Data

US 2011/0234275 A1   Sep. 29, 2011

(30) Foreign Application Priority Data

Mar. 26, 2010 (JP) ................................ 2010-073375

(51) Int. Cl.
  *H03L 7/06* (2006.01)
(52) U.S. Cl. ......... 327/157; 327/148; 327/149; 327/158
(58) Field of Classification Search .................. 327/148, 327/149, 157, 158
  See application file for complete search history.

(56) References Cited

U.S. PATENT DOCUMENTS

| | | | |
|---|---|---|---|
| 7,649,421 B2 * | 1/2010 | Victor | 331/16 |
| 7,667,529 B2 * | 2/2010 | Consuelo et al. | 327/536 |
| 8,076,962 B2 * | 12/2011 | Chen et al. | 327/157 |
| 8,179,175 B2 * | 5/2012 | Tang | 327/157 |
| 2003/0155951 A1 * | 8/2003 | Bushey et al. | 327/157 |
| 2007/0085580 A1 * | 4/2007 | Singh et al. | 327/158 |
| 2010/0244914 A1 * | 9/2010 | Kim et al. | 327/157 |
| 2011/0063004 A1 * | 3/2011 | Chen et al. | 327/157 |
| 2011/0234275 A1 * | 9/2011 | Sato | 327/157 |
| 2011/0304366 A1 * | 12/2011 | Kanda et al. | 327/157 |

FOREIGN PATENT DOCUMENTS

| | | |
|---|---|---|
| JP | 6-276090 A | 9/1994 |
| JP | 10-340544 A | 12/1998 |
| JP | 2000-013222 A | 1/2000 |

* cited by examiner

*Primary Examiner* — Lincoln Donovan
*Assistant Examiner* — Adam Houston
(74) *Attorney, Agent, or Firm* — Fujitsu Patent Center

(57) ABSTRACT

In the PLL circuit including a phase comparator, a charge pump circuit, a loop filter, and a voltage controlled oscillator, the loop band after the locking can be expanded in such a manner that, when the phase difference between a reference clock signal and a feedback clock signal is larger than a threshold value, an output current corresponding to the phase difference is outputted by reducing the change of the output current per unit amount of the phase difference, and that, when the phase difference is at most the threshold value, the output current corresponding to the phase difference is outputted by increasing the change of the output current per unit amount of the phase difference.

10 Claims, 6 Drawing Sheets

PLL CIRCUIT

CROSS-REFERENCE TO RELATED APPLICATION

This application is based upon and claims the benefit of priority of the prior Japanese Patent Application No. 2010-073375, filed on Mar. 26, 2010, the entire contents of which are incorporated herein by reference.

FIELD

The present embodiment relates to a PLL (Phase Locked Loop) circuit.

BACKGROUND

A PLL circuit configured to synchronize the phase of an output clock signal with the phase of an inputted reference clock signal so as to output the synchronized output clock signal from a voltage controlled oscillator (VCO) is used in various fields. The PLL circuit decreases the frequency of the output clock signal when the phase of the output clock signal is advanced with respect to the phase of the reference signal. The PLL circuit increases the frequency of the output clock signal when the phase of the output clock signal is delayed from the phase of the reference signal. Thereby, the PLL circuit adjusts the phase of the output clock signal to the phase of the reference clock signal so as to make the frequency of the output clock signal locked (converged) to a target frequency.

As the PLL circuit, various circuit configurations for reducing the locking time and the jitter have been proposed. For example, a configuration provided with a plurality of charge pump circuits has been proposed (see, for example, Japanese Laid-Open Patent Publication No. 6-276090, Japanese Laid-Open Patent Publication No. 2000-13222, and Japanese Laid-Open Patent Publication No. 10-340544). For example, the PLL circuit described in Japanese Laid-Open Patent Publication No. 6-276090 is provided with a charge pump circuit different from an ordinary charge pump circuit in addition to the ordinary charge pump circuit. Further, the PLL circuit operates the ordinary charge pump circuit and the different charge pump circuit at the time of locking up (the period until the frequency is locked) so as to allow a capacitor of a loop filter to be charged/discharged at high speed. After the locking, the PLL circuit operates only the ordinary charge pump circuit, and sets the different charge pump circuit in the off-state. In this way, the PLL circuit is configured to reduce the locking time and to suppress the noise after the locking.

As described above, in the PLL circuit described in Japanese Laid-Open Patent Publication No. 6-276090, the change in the charge pump current at the time of locking-up is made larger than the change in the charge pump current during the ordinary operation (after the locking) to thereby reduce the locking time and suppress the variation of one period, that is, so called the period jitter, in the output clock signal after the locking. Here, as the jitter to be taken into consideration in the clock signal outputted by the PLL circuit, there is the long term jitter in addition to the period jitter.

Figure 10:
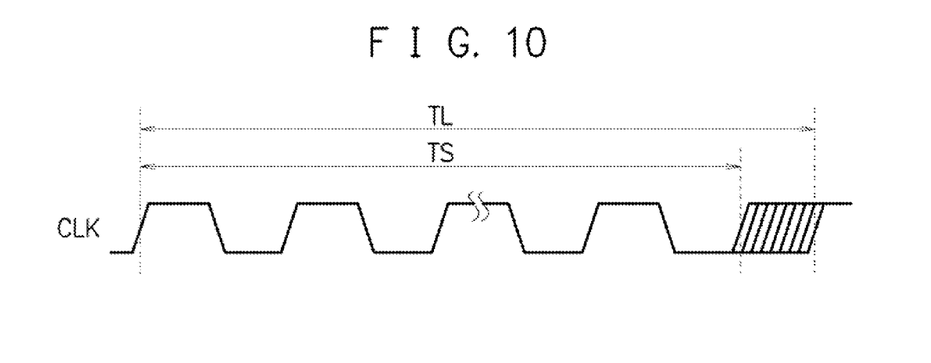
FIG. 10 is a figure for explaining a long term jitter.

The long term jitter is the jitter which occurs in the output clock signal over a long period after the locking. The maximum and minimum values of the time from a certain clock cycle to the other clock cycle separated from the certain clock cycle for a fixed period of time (which is sufficiently longer than the period of the output clock signal) are set as TL and TS, respectively. The long term jitter is represented by (TL-TS) (see FIG. 10).

As a method for suppressing the long term jitter of the clock signal outputted by the PLL circuit, it is considered to set the loop band in the PLL circuit to be wide. For example, it is possible to expand the loop band by increasing the change in the charge pump current with respect to the phase difference between the reference clock signal and the output clock signal without changing the other parameters. However, when the change in the charge pump current with respect to the phase difference is increased, the change in the input voltage of the VCO corresponding to the phase difference is also increased, and thereby the change in the frequency of the output clock signal with respect to the phase difference is increased. In general, the phase difference at the time of locking-up (particularly in the initial stage of the locking operation) becomes larger than the phase difference after the locking. Thus, when the change in the charge pump current with respect to the phase difference is increased, the overshoot at the time of locking-up is caused to greatly exceed an allowable limit in some cases. This prevents the normal operation of the circuit so that the frequency of the clock signal cannot be locked to the target frequency.

SUMMARY

An aspect of the present embodiment provides a PLL circuit including: a phase comparator for comparing a phase of a reference clock signal with a phase of a feedback clock signal and outputting a control signal corresponding to a difference between the phases; a charge pump circuit for outputting an output current according to the control signal; a loop filter for changing accumulated charges by the output current of the charge pump circuit; and a voltage controlled oscillator for outputting an output clock signal at an oscillation frequency corresponding to an input voltage based on the amount of the charges accumulated in the loop filter. When the phase difference between the reference clock signal and the feedback clock signal is larger than a threshold value, the charge pump circuit outputs a first output current corresponding to the phase difference. When the phase difference between the reference clock signal and the feedback clock signal is not larger than the threshold value, the charge pump circuit outputs a second output current which is larger than the first output current and corresponds to the phase difference.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

In the following, an embodiment will be described with reference to the accompanying drawings.

Figure 1:
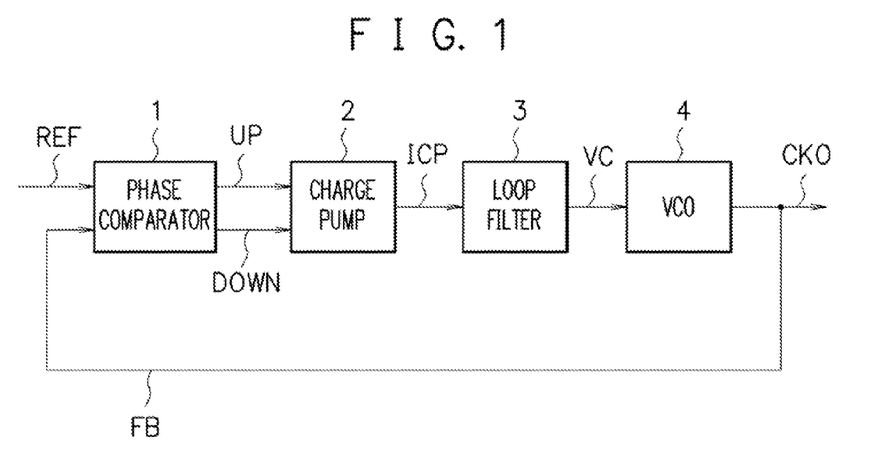
FIG. 1 is a block diagram illustrating a configuration example of a PLL circuit in an embodiment.

FIG. 1 is a block diagram illustrating a configuration example of a PLL (Phase Locked Loop) circuit in a present embodiment. The PLL circuit in the present embodiment includes a phase comparator 1, a charge pump circuit 2, a loop filter 3, and a voltage controlled oscillator (VCO) 4.

A reference clock signal REF and a feedback clock signal FB are inputted into the phase comparator 1. The reference clock signal REF is an externally supplied signal, and the feedback clock signal FB is a signal based on an output clock signal CKO outputted from the voltage controlled oscillator 4. The phase comparator 1 compares the phase of the reference clock signal REF with the phase of the feedback clock signal FB, and outputs, to the charge pump circuit 2, an up signal UP and a down signal DOWN corresponding to the difference between the phases. For example, in the case where the phase of the feedback clock signal FB is delayed from the phase of the reference clock signal REF (the frequency is low), the phase comparator 1 outputs the up signal UP having a pulse length proportional to the phase difference. On the other hand, in the case where the phase of the feedback clock signal FB is advanced with respect to the phase of the reference clock signal REF (the frequency is high), the phase comparator 1 outputs the down signal DOWN having a pulse length proportional to the phase difference.

The charge pump circuit 2 outputs a charge pump current ICP to the loop filter 3 according to the up signal UP and the down signal DOWN. The current amount of the charge pump current ICP is changed according to the pulse length of the up signal UP and the down signal DOWN. Charges are charged or discharged in or from a capacitor (not illustrated) of the loop filter 3 by the charge pump current ICP of the charge pump circuit 2, so that a voltage VC based on the amount of the charges accumulated in the capacitor is outputted from the loop filter 3. That is, the loop filter 3 outputs the voltage VC corresponding to the phase difference between the reference clock signal REF and the feedback clock signal FB.

The voltage controlled oscillator 4 is an oscillator whose oscillation frequency is changed according to the input voltage. For example, the oscillation frequency of the voltage controlled oscillator 4 is increased according to the increase in the input voltage. The voltage controlled oscillator 4 uses, as its input voltage, the voltage VC determined based on the amount of the charges accumulated in the loop filter 3, and oscillates at the frequency corresponding to the input voltage so as to output the output clock signal CKO of the oscillation frequency.

Note that, in the present embodiment, the output clock signal CKO from the voltage controlled oscillator 4 is inputted, as it is, into the phase comparator 1 as the feedback clock signal FB, but the present embodiment is not limited to this. The feedback clock signal FB may be any signal as long as the signal is based on the output clock signal CKO. For example, a signal may also be formed by dividing, by a frequency divider, the frequency of the output clock signal CKO outputted from the voltage controlled oscillator 4, so as to be supplied to the phase comparator 1 as the feedback clock signal FB.

Next, the operation of the PLL circuit will be described.

The phase comparator 1 compares the phase of the inputted reference clock signal REF with the phase of the feedback clock signal FB, so as to output the up signal UP or the down signal DOWN to the charge pump circuit 2 according to the difference between the phases. Then, according to the up signal UP or the down signal DOWN, the charge pump circuit 2 outputs the charge pump current ICP. Note that as a result of the comparison by the phase comparator 1, when the phase of the reference clock signal REF coincides with the phase of the feedback clock signal FB, the phase comparator 1 does not output (activate) the up signal UP and the down signal DOWN, so that the charge pump circuit 2 does not output the charge pump current ICP.

The charges in the loop filter 3 are charged or discharged by the charge pump current ICP of the charge pump circuit 2 to control the voltage VC, so that the voltage controlled oscillator 4 outputs, as the output clock signal CKO, the oscillation signal of the oscillation frequency corresponding to the voltage VC.

Here, when receiving the up signal UP, the charge pump circuit 2 injects the charges into the loop filter 3, so as to increase the voltage VC. On the contrary, when receiving the down signal DOWN, the charge pump circuit 2 extracts the charges from the loop filter 3, so as to reduce the voltage VC. Therefore, when the up signal UP is outputted from the phase comparator 1, the voltage VC, as the input voltage of the voltage controlled oscillator 4, is increased so as to increase the oscillation frequency of the output clock signal CKO. On the other hand, when the down signal DOWN is outputted from the phase comparator 1, the voltage VC is reduced so as to reduce the oscillation frequency of the output clock signal CKO.

This operation is repeatedly performed until the phase of the reference clock signal REF coincides with the phase of the feedback clock signal FB, and thereby the output clock signal CKO synchronized in phase with the reference clock signal REF is obtained. That is, when the phase of the reference clock signal REF does not coincide with the phase of the feedback clock signal FB, the voltage VC is changed by the charge pump current ICP corresponding to the difference between the phases, and thereby the output clock signal CKO is changed so as to reduce the phase difference. On the other hand, when the phase of the reference clock signal REF is coincident with the phase of the feedback clock signal FB, since the charge pump current ICP is not outputted, the voltage VC is not changed, and the output clock signal CKO synchronized in phase with the reference clock signal REF is outputted.

Figure 2:
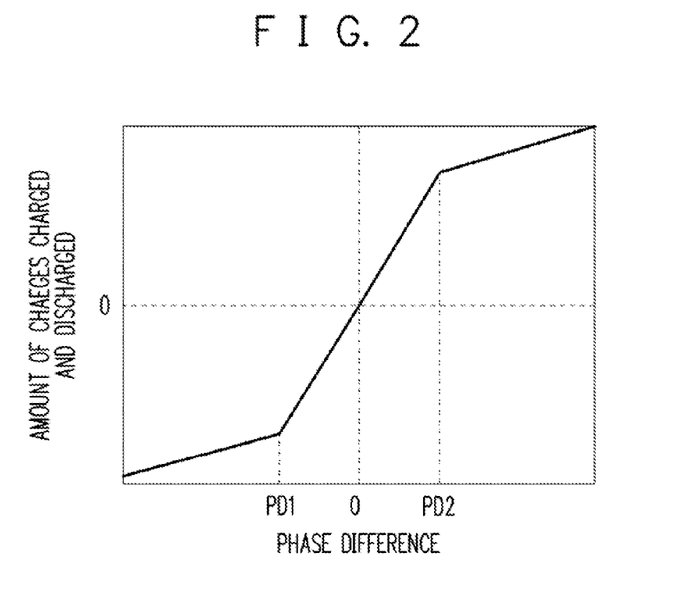
FIG. 2 is a figure illustrating a relationship between the phase difference and the output of a charge pump circuit in the present embodiment.

The charge pump circuit 2 outputs the charge pump current ICP according to the magnitude of the phase difference between the reference clock signal REF and the feedback clock signal FB so that a relationship of the phase difference with the amount of the charges charged and discharged by the charge pump current ICP is established as illustrated in FIG. 2. That is, when the phase difference between the reference clock signal REF and the feedback clock signal FB is within a range between certain threshold values PD1 and PD2 (PD1<0<PD2), the charge pump circuit 2 outputs the charge pump current ICP so that the amount of the charges charged and discharged is changed in proportion to the phase difference with a gradient A. Further, when the phase difference between the reference clock signal REF and the feedback clock signal FB is not within the range between the certain threshold values PD1 and PD2, the charge pump circuit 2 outputs the charge pump current ICP so that the amount of the charges charged and discharged is changed in proportion to the phase difference with a gradient B (B<A).

Here, the gradient of the amount of the charges charged and discharged is equivalent to the charge pump current ICP. That is, when the magnitude of the phase difference between the reference clock signal REF and the feedback clock signal FB is at most the certain threshold value, the charge pump circuit 2 increases the change amount of the charge pump current ICP per unit amount of the phase difference, so as to output the charge pump current ICP corresponding to the phase difference. On the other hand, when the magnitude of the phase difference between the reference clock signal REF and the feedback clock signal FB is larger than the certain threshold value, the charge pump circuit 2 reduces the change amount of the charge pump current ICP per unit amount of the phase difference, so as to output the charge pump current ICP corresponding to the phase difference.

As described above, in the present embodiment, according to the phase difference between the reference clock signal REF and the feedback clock signal FB, the charge pump circuit 2 changes the change of the charge pump current ICP per unit amount of the phase difference. In the present embodiment, after the frequency of the output clock signal CKO is locked to the target frequency, the charge pump circuit 2 increases the change of the charge pump current ICP with respect to the phase difference between the reference clock signal REF and the feedback clock signal FB. Thereby, the loop band in the PLL circuit can be increased after the locking, and the long term jitter in the output clock signal after the locking can be suppressed.

Further, in the present embodiment, at the time of locking-up until the frequency of the output clock signal CKO is locked to the target frequency, the charge pump circuit 2 reduces the change of the charge pump current ICP with respect to the phase difference between the reference clock signal REF and the feedback clock signal FB. Thereby, even when the phase difference between the reference clock signal REF and the feedback clock signal FB is increased at the time of locking-up, the change of the charge pump current ICP with respect to the phase difference is suppressed as compared with the change of the charge pump current ICP after the locking. That is, at the time of locking-up, the change of the voltage VC, as the input voltage of the voltage controlled oscillator 4, is suppressed with respect to the phase difference, so that the overshoot at the time of locking-up can be suppressed.

Figure 3:
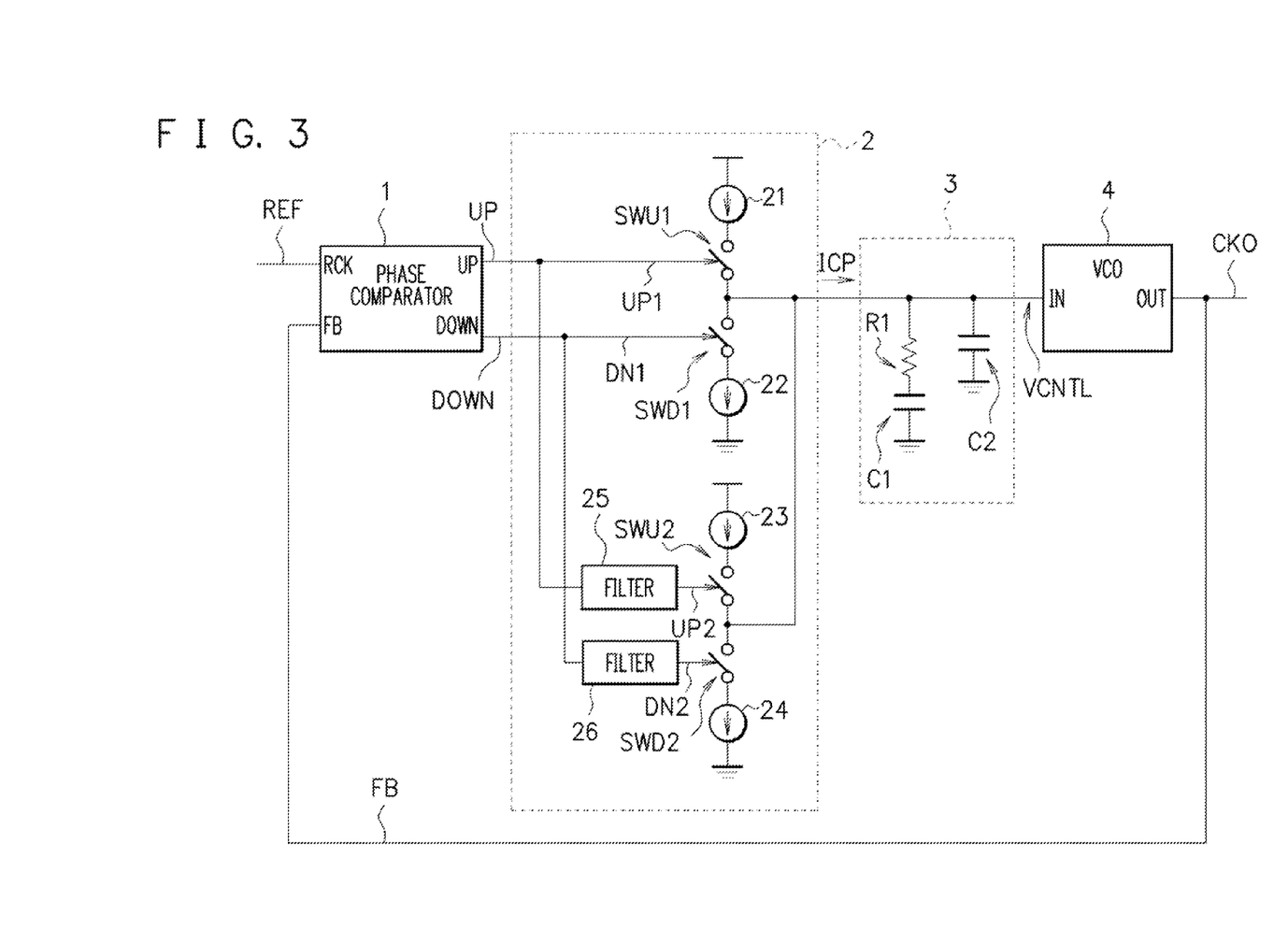
FIG. 3 is a figure illustrating a configuration example of a PLL circuit in the present embodiment.

FIG. 3 is a figure illustrating a configuration example of the PLL circuit in the present embodiment. In FIG. 3, components, and the like, having the same functions as the functions of the components, and the like, illustrated in FIG. 1 are denoted by the same reference numerals and characters, and hence the duplicated explanation thereof is omitted.

In the PLL circuit illustrated in FIG. 3, the charge pump circuit 2 has two current type charge pump circuits which are connected in parallel between the phase comparator 1 and the loop filter 3.

The first current type charge pump circuit is configured by connecting a current source 21, a switch SWU1, a switch SWD1, and a current source 22 in series in this order between a power supply potential and a reference potential (for example, ground potential). The switch SWU1 is on/off controlled by an up signal UP1 (up signal UP outputted from the phase comparator 1), and the switch SWD1 is on/off controlled by a down signal DN1 (down signal DOWN outputted from the phase comparator 1).

Further, the second current type charge pump circuit is configured by connecting a current source 23, a switch SWU2, a switch SWD2, and a current source 24 in series in this order between the power supply potential and the reference potential (for example, ground potential). The switch SWU2 is on/off controlled by an up signal UP2 outputted from a filer circuit 25, and the switch SWD2 is on/off controlled by a down signal DN2 outputted from a filter circuit 26.

The filter circuit 25 receives the up signal UP outputted from the phase comparator 1, and outputs the up signal UP2 based on the up signal UP. Similarly, the filter circuit 26 receives the down signal DOWN outputted from the phase comparator 1, and outputs the down signal DN2 based on the down signal DOWN. Here, each of the up signal UP and the down signal DOWN, which are outputted from the phase comparator 1, is a signal having a pulse length corresponding to the phase difference between the reference clock signal REF and the feedback clock signal FB. The filter circuits 25 and 26 are, for example, high-pass filters for respectively limiting the pulse length of the up signal UP and the down-signal DOWN, respectively inputted thereto, to at most a certain pulse length (time constant TC in the present embodiment), and then respectively output the up signal UP and the down signal DOWN as the up signal UP2 and the down signal DN2.

Here, a charge pump current ICP2 outputted by the second current type charge pump circuit is larger than a charge pump current ICP1 outputted by the first current type charge pump circuit. That is, the current amount of the charge pump current ICP2 per unit amount of the phase difference between the reference clock signal REF and the feedback clock signal FB is larger than the current amount of the charge pump current ICP1 per unit amount of the phase difference.

The loop filter 3 has a resistor R1 and capacitors C1 and C2. The series circuit having the resistor R1 and the capacitor C1 is connected between the input terminal of the loop filter 3 and the reference potential. Further, the capacitor C2 is connected between the input terminal of the loop filter 3 and the reference potential. A voltage VCNTL at the output end of the loop filter 3 is supplied as the input voltage of the voltage controlled oscillator 4.

Figure 4A:
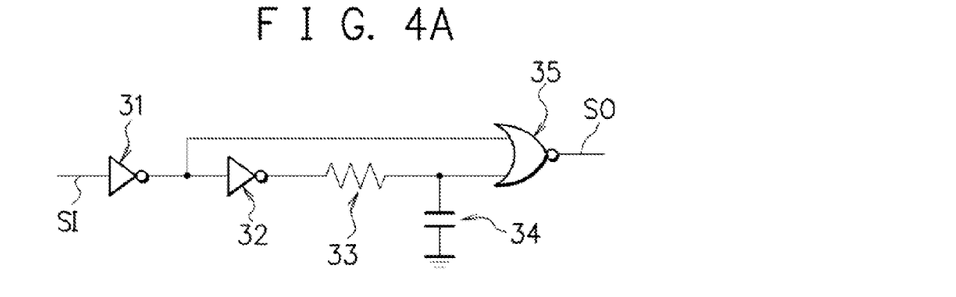
FIG. 4A and FIG. 4B are figures illustrating an example of a filter circuit in the PLL circuit illustrated in FIG. 3.

FIG. 4A is a figure illustrating an example of the filter circuits 25 and 26 illustrated in FIG. 3. Note that the filter circuit illustrated in FIG. 4A is an example, and the filter circuits 25 and 26 are not limited to this.

As illustrated in the configuration example of FIG. 4A, each of the filter circuits 25 and 26 has inverters 31 and 32, a resistor 33, a capacitor 34, and a NOR circuit (NOR operation circuit) 35. An inputted signal SI is inputted into one input terminal of the NOR circuit 35 via the inverter 31. Further, the output of the inverter 31 is inputted into the other input terminal of the NOR circuit 35 via the inverter 32. The input to the other input terminal of the NOR circuit 35 is inputted by being delayed by the resistor 33 and the capacitor 34 by a time corresponding to the time constant TC determined by the resistance value of the resistor 33 and the capacitance value of the capacitor 34. The output of the NOR circuit 35 is outputted as an output signal SO of the filter circuit.

Figure 4B:
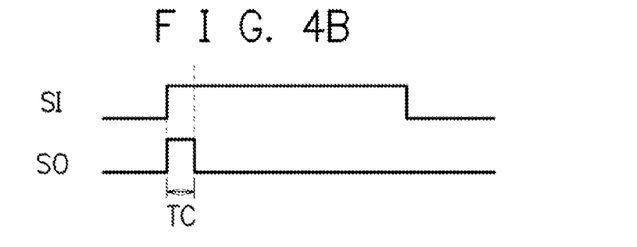

As illustrated in FIG. 4B, the filter circuit configured as described above changes the output signal SO from a low level to a high level at the time when the input signal SI is changed from the low level to the high level. However, in the case where the high level period of the input signal SI is longer than the time constant TC, the filter circuit sets the output signal SO at the high level only during the period of the time constant TC.

As illustrated in FIG. 3, the up signal UP and the down signal DOWN, which are outputted from the phase comparator 1, are supplied as they are to the first current type charge pump circuit of the charge pump circuit 2. Further, the up signal UP and the down signal DOWN, which are outputted from the phase comparator 1, are supplied to the second current type charge pump circuit of the charge pump circuit 2 respectively via the filter circuits 25 and 26. With the above described configuration, the first current type charge pump circuit always outputs the charge pump current ICP1 corresponding to the up signal UP and the down signal DOWN. On the other hand, the second current type charge pump circuit outputs the charge pump current ICP2 corresponding to the up signal UP or the down signal DOWN only during the period of the time constant TC after the up signal UP or the down signal DOWN is activated. The sum of the charge pump current ICP1 and the charge pump current ICP2 is supplied as the charge pump current ICP to the loop filter 3. Here, as described above, each of the up signal UP and the down signal DOWN is a signal having a pulse length corresponding to the phase difference between the reference clock signal REF and the feedback clock signal FB. Therefore, the first current type charge pump circuit outputs the charge pump current ICP1 corresponding to the up signal UP and the down signal DOWN irrespective of the magnitude of the phase difference between the reference clock signal REF and the feedback clock signal FB. The second current type charge pump circuit outputs the charge pump current ICP2 in the case where the phase difference between the reference clock signal REF and the feedback clock signal FB is at most the certain threshold value.

Figure 5:
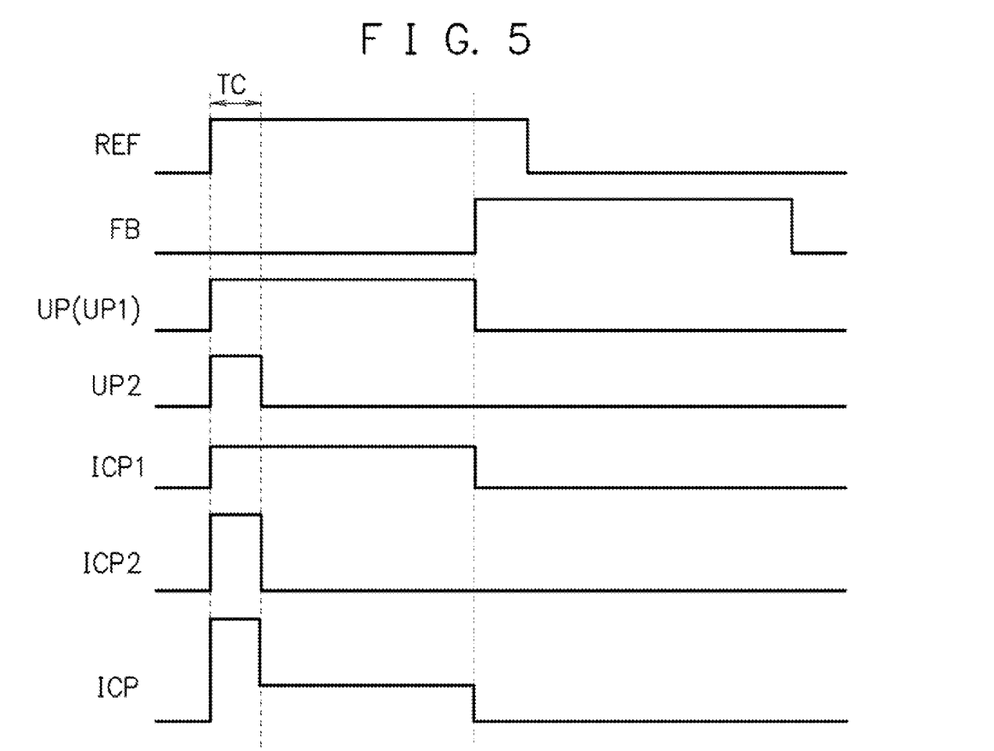
FIG. 5 is a figure for explaining the operation of the PLL circuit illustrated in FIG. 3.

As illustrated in an example of FIG. 5, when the phase of the feedback clock signal FB is advanced with respect to the reference clock signal REF by an amount far greater than the certain threshold value (time constant TC), the activation period of the up signal UP outputted from the phase comparator 1 is longer than the period corresponding to the time constant TC. However, the up signal UP outputted from the phase comparator 1 is supplied to the second current type charge pump circuit by the filter circuit 25 only during the period corresponding to the time constant TC. At this time, the charge pump currents ICP1 and ICP2 respectively outputted from the first and second current type charge pump circuits, and the charge pump current ICP inputted to the loop filter 3 become as illustrated in FIG. 5. That is, the charge pump current ICP inputted to the loop filter 3 is more dependent on the charge pump current ICP1 than the charge pump current ICP2.

Figure 6:
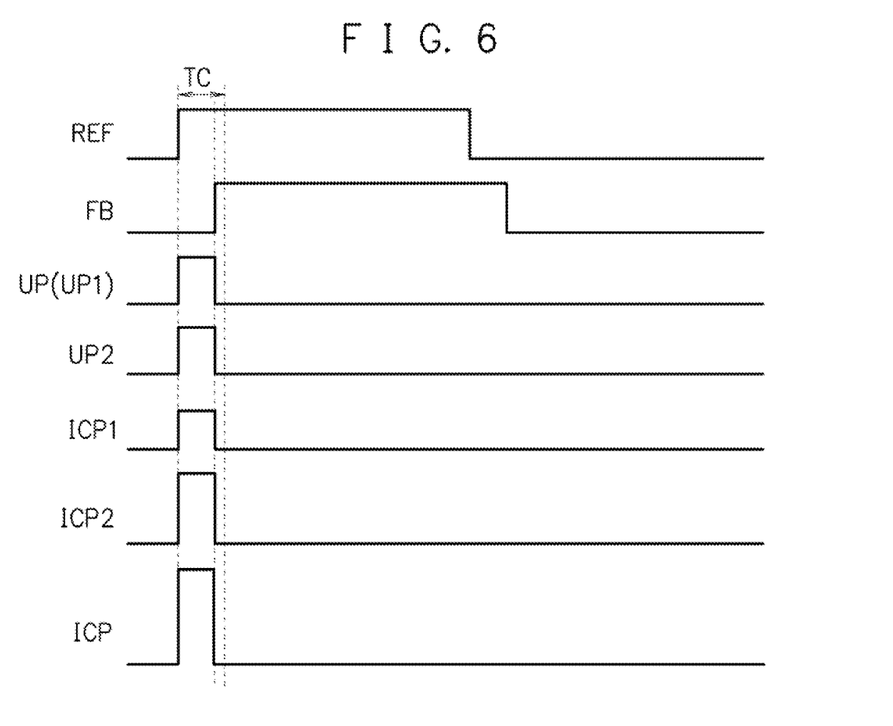
FIG. 6 is a figure for explaining the operation of the PLL circuit illustrated in FIG. 3.

On the other hand, as illustrated in an example of FIG. 6, when the phase of the feedback clock signal FB is advanced with respect to the reference clock signal REF by at most the certain threshold value (time constant TC), the activation period of the up signal UP outputted from the phase comparator 1 is at most the period corresponding to the time constant TC. Therefore, the same signal as the up signal UP outputted from the phase comparator 1 is also supplied to the second current type charge pump circuit. At this time, the charge pump currents ICP1 and ICP2 respectively outputted from the first and second current type charge pump circuits, and the charge pump current ICP inputted to the loop filter 3 become as illustrated in FIG. 6. That is, the charge pump current ICP1 makes almost no contribution to the charge pump current ICP inputted to the loop filter 3, and the charge pump current ICP is dependent on the charge pump current ICP2.

As described above, according to the PLL circuit illustrated in FIG. 3, the charge pump current ICP is outputted as follows by suitably setting the time constant of the filter circuits 25 and 26.

(1) The case where the phase difference between the reference clock signal REF and the feedback clock signal FB is larger than the time constant The period in which both the charge pump currents ICP1 and ICP2 are outputted is sufficiently short as compared with the period in which only the charge pump current ICP1 is outputted after both the charge pump currents ICP1 and ICP2 are outputted. Thus, in this case, the charge pump current ICP is approximately equal to the charge pump current ICP1.

(2) The case where the phase difference between the reference clock signal REF and the feedback clock signal FB is at most the time constant The charge pump currents ICP1 and ICP2 are outputted in the same period, and the charge pump current ICP2 is sufficiently larger than the charge pump current ICP1. Thus, the charge pump current ICP is approximately equal to the charge pump current ICP2.

Thereby, the charge pump current ICP can be outputted from the charge pump circuit 2 so as to satisfy the characteristics illustrated in FIG. 2. Therefore, the long term jitter in the output clock signal after the locking can be suppressed, and the overshoot at the time of locking-up can also be suppressed.

Figure 8:
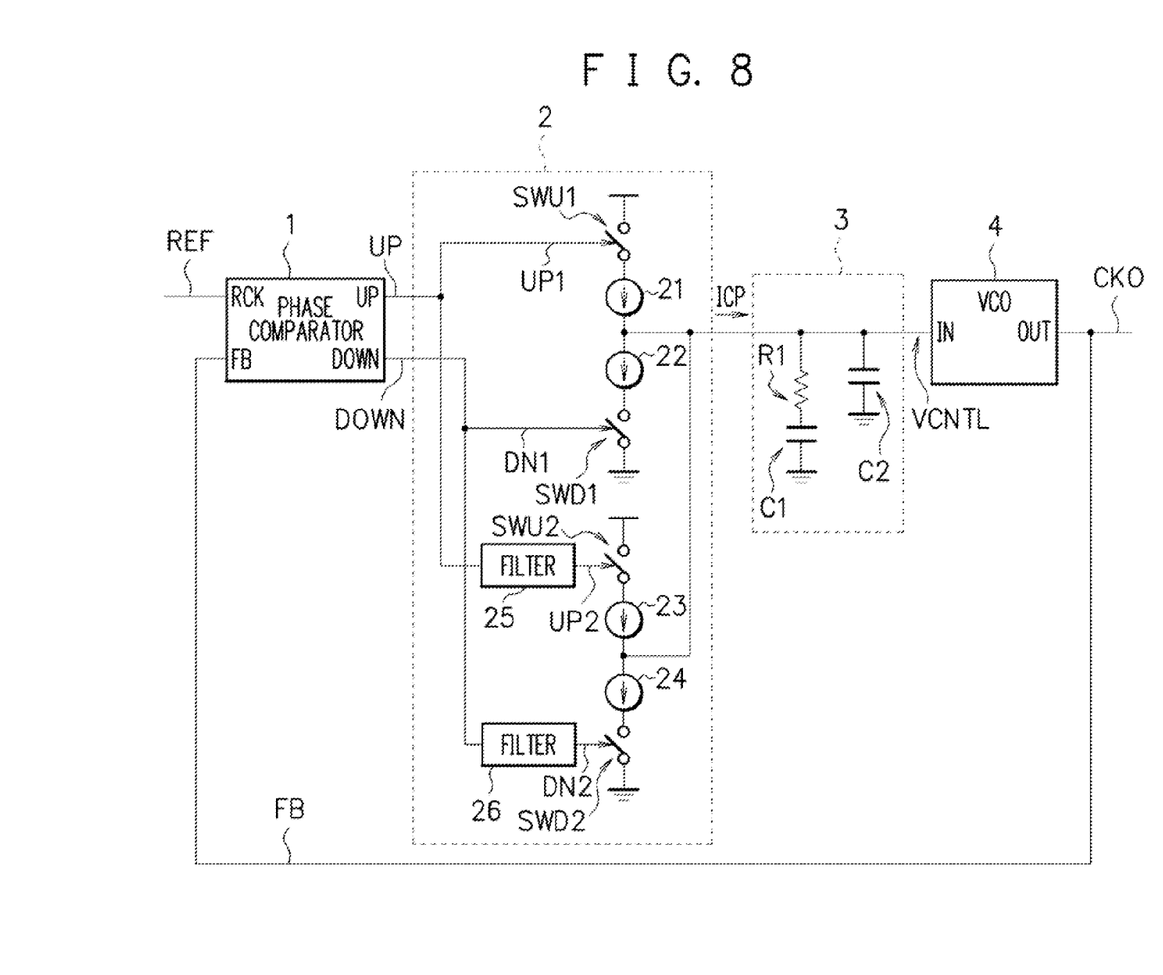
FIG. 8 is a figure illustrating another configuration example of the PLL circuit in the present embodiment.

Note that in the example illustrated in FIG. 3, the first current type charge pump circuit is configured by connecting the current source 21, the switch SWU1, the switch SWD1, and the current source 22 in series in this order between the power supply potential and the reference potential. Further, the second current type charge pump circuit is configured by connecting the current source 23, the switch SWU2, the switch SWD2, and the current source 24 in series in this order between the power supply potential and the reference potential. However, the configuration of the first and second current type charge pump circuits is not limited to the configuration illustrated in FIG. 3. For example, as illustrated in FIG. 8, the first current type charge pump circuit may be configured by connecting the switch SWU1, the current source 21, the current source 22, and the switch SWD1 in series in this order between the power supply potential and the reference potential. Further, for example, as illustrated in FIG. 8, the second current type charge pump circuit may also be configured by connecting the switch SWU2, the current source 23, the current source 24, and the switch SWD2 in series in this order between the power supply potential and the reference potential. Further, one of the first current type charge pump circuit and the second current type charge pump circuit may be configured as illustrated in FIG. 3, and the other may be configured as illustrated in FIG. 8.

Figure 9:
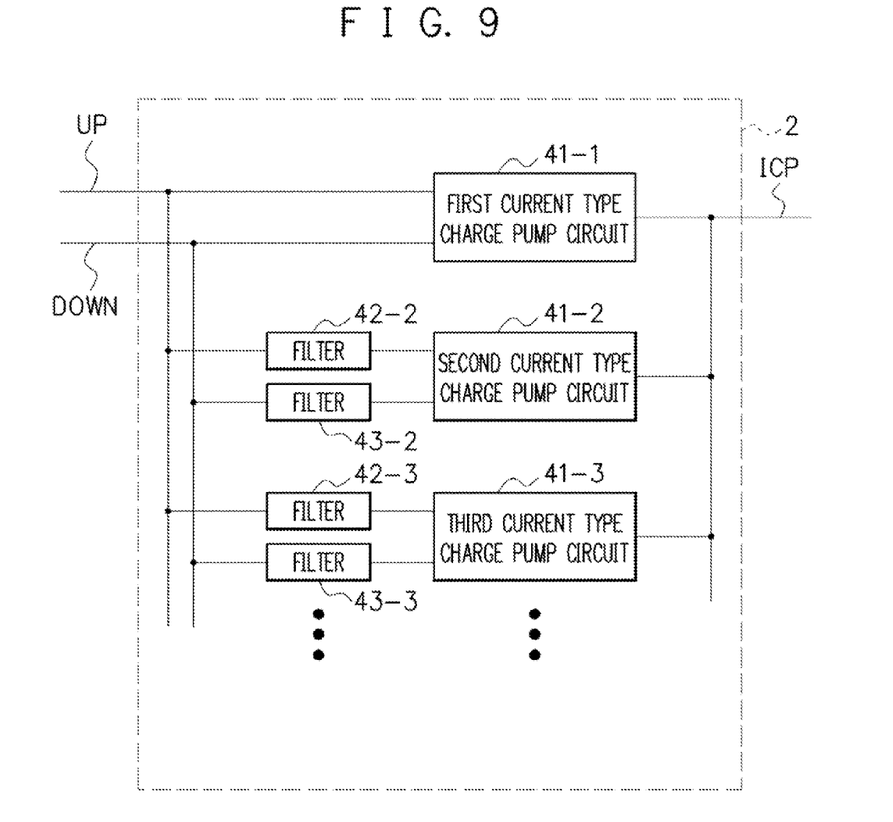
FIG. 9 is a figure illustrating another configuration example of the charge pump circuit in the present embodiment.

Further, in the example illustrated in FIG. 3, the charge pump circuit 2 is configured by connecting the two current type charge pump circuits in parallel with each other. However, the charge pump circuit 2 is not limited to this, and may also be configured by connecting three or more current type charge pump circuits in parallel with each other. FIG. 9 is a figure illustrating a configuration example of the charge pump circuit 2 having three or more current type charge pump circuits. In FIG. 9, reference character 41-m (where m is a natural number) denotes the m-th current type charge pump circuit, and reference characters 42-n and 43-n (where n is a natural number of two or more) denote filter circuits.

The up signal UP outputted from the phase comparator 1 is inputted to the filter circuit 42-n, and the down signal DOWN outputted from the phase comparator 1 is inputted to the filter circuit 43-n. The up signal UP and the down signal DOWN, which are respectively inputted to the filter circuits 42-n and 43-n, are respectively limited to at most a certain pulse length (time constant TCn) and are inputted to the corresponding current type charge pump circuit 41-m.

The outputs of the corresponding filter circuits 42-n and 43-n are inputted to the m-th current type charge pump circuit 41-m (however, the up signal UP and the down signal DOWN outputted from the phase comparator 1 are inputted to the first current type charge pump circuit 41-1). The m-th current type charge pump circuit 41-m outputs a charge pump current ICPm corresponding to the inputted signal. The sum of the charge pump current ICPm outputted from each of the current type charge pump circuits 41-m is supplied as the charge pump current ICP to the loop filter 3.

Here, when i and j are set as natural numbers satisfying the relationship of j<i, the charge pump current ICPi outputted by the i-th current type charge pump circuit is set larger than the charge pump current ICPj outputted by the j-th current type charge pump circuit. That is, the current amount of the charge pump current ICPi per unit amount of the phase difference between the reference clock signal REF and the feedback clock signal FB is set larger than the current amount of the charge pump current ICPj per unit amount of the phase difference. Further, the time constant TCi of the filter circuits 42-i and 43-i is set shorter than the time constant TCj of the filter circuits 42-j and 43-j. That is, when the up signal UP and the down signal DOWN which are outputted from the phase comparator 1 are activated during a sufficiently long period of time, the period in which the charge pump current ICPm is outputted according to the activation of the up signal UP and the down signal DOWN is reduced as m increases.

With this configuration, the change of the charge pump current ICP corresponding to the phase difference between the reference clock signal REF and the feedback clock signal FB can be controlled in multi stages, and the change of the charge pump current ICP per unit amount of the phase difference can be reduced as the phase difference is increased. Therefore, the loop band in the PLL circuit can be expanded after the locking, and the long term jitter in the output clock signal after the locking can be suppressed. Further, at the time of locking-up, the change in the input voltage VC of the voltage controlled oscillator 4 with respect to the phase difference can be suppressed, and the overshoot at the time of locking-up can be suppressed.

Figure 7:
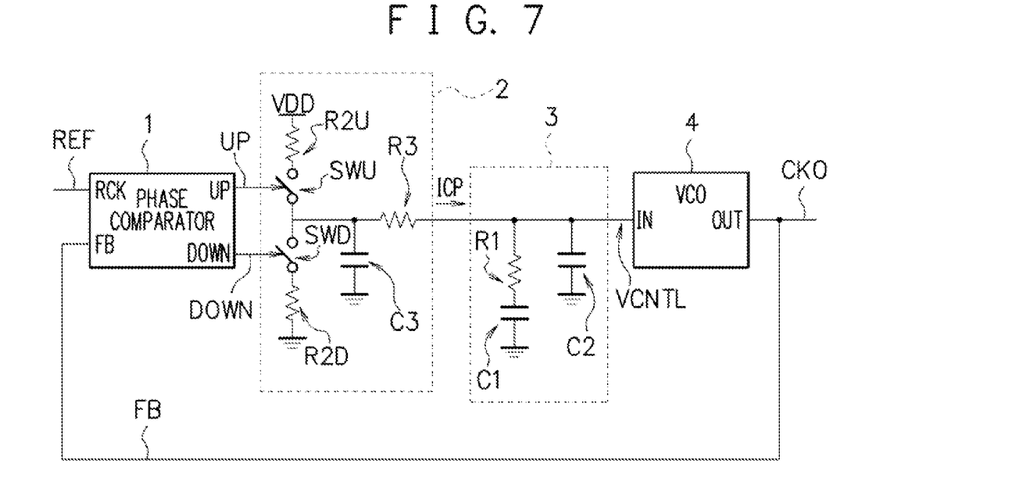
FIG. 7 is a figure illustrating another configuration example of the PLL circuit in the present embodiment.

FIG. 7 is a figure illustrating another configuration example of the PLL circuit according to the present embodiment. In FIG. 7, components, and the like, having the same functions as the functions of the components, and the like, illustrated in FIG. 1 and FIG. 3 are denoted by the same reference numerals and characters, and the duplicated explanation thereof is omitted.

In the PLL circuit illustrated in FIG. 7, the charge pump circuit 2 is a voltage source type charge pump circuit. In the example illustrated in FIG. 7, the charge pump circuit 2 is configured such that switches SWU and SWD are connected in series between a voltage source of voltage VDD and a reference potential (for example, ground potential), and such that the mutual connection point of the switches SWU and SWD is connected to the output end of the charge pump circuit 2 via a resistor R3. The switch SWU is on/off controlled by the up signal UP outputted from the phase comparator 1, and the switch SWD is on/off controlled by the down signal DOWN outputted from the phase comparator 1. Further, a capacitor C3 is connected between the mutual connection point of the switches SWU and SWD, and the reference potential. Note that each of resistors R2U and R2D schematically represents the on-resistance of each of the switches SWU and SWD, but also includes a resistor separately provided to obtain a desired value of the time constant as will be described below.

In the PLL circuit illustrated in FIG. 7, it is assumed that when the resistance value of the resistors R2U and R2D is set as RA, and when the resistance value of the resistor R3 is set as RB, RB is sufficiently larger than RA. Further, it is assumed that the voltage VCNTL at the time of locking is set to VDD/2, and the capacitance value of the capacitor C3 is set as CA. At this time, when the phase difference between the reference clock signal REF and the feedback clock signal FB is larger than the time constant (RA×CA), since the capacitor C3 makes almost no contribution, the charge pump current ICP is approximately equal to (VDD/2)/RB. On the other hand, when the phase difference between the reference clock signal REF and the feedback clock signal FB is at most the time constant (RA×CA), the capacitor C3 acts to make the charge pump current ICP approximately equal to (VDD/2)/RA. As described above, RB is sufficiently larger than RA, and hence (VDD/2)/RB is sufficiently smaller than (VDD/2)/RA. Therefore, when the time constant (RA×CA) is suitably set, the charge pump current ICP can be outputted from the charge pump circuit 2 so as to satisfy the characteristics illustrated in FIG. 2. Therefore, the long term jitter in the output clock signal after the locking can be suppressed. Further, the overshoot at the time of locking-up can be suppressed.

The disclosed PLL circuit increases the change of the output current of the charge pump circuit with respect to the phase difference between the reference clock signal and the feedback clock signal when the phase difference is small, such as after the locking. Therefore, the PLL circuit can expand its loop band after the locking, and hence has an effect of suppressing the long term jitter in the output clock signal. Further, when the phase difference between the reference clock signal and the feedback clock signal tends to be increased at a time, such as the time of locking-up before the frequency is locked, the PLL circuit reduces the change of the output current of the charge pump circuit with respect to the phase difference, and hence has an effect of suppressing the overshoot at the time of locking-up.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:
1. A PLL circuit comprising:
a phase comparator configured to compare a phase of a reference clock signal with a phase of a feedback clock signal based on an output clock signal and outputting a control signal corresponding to a difference between the phases;
a charge pump circuit configured to output an output current according to the control signal;
a loop filter configured to change accumulated charges by the output current of the charge pump circuit; and
a voltage controlled oscillator configured to output the output clock signal at an oscillation frequency corre- sponding to an input voltage based on the amount of charges accumulated in the loop filter, wherein the charge pump circuit is configured to output a first output current according to the phase difference between the reference clock signal and the feedback clock signal in a case where the phase difference is larger than a threshold value, and the charge pump circuit is configured to output a second output current larger than the first output current according to the phase difference between the reference clock signal and the feedback clock signal in the case where the phase difference is smaller than the threshold value.

2. The PLL circuit according to claim 1, wherein the charge pump circuit comprises a first charge pump circuit and a second charge pump circuit, and wherein the first charge pump circuit and the second charge pump circuit are connected in parallel with each other between the phase comparator and the loop filter.

3. The PLL circuit according to claim 2, wherein the charge pump circuit is configured such that the first charge pump circuit always outputs an output current according to the control signal irrespective of the magnitude of the phase difference between the reference clock signal and the feedback clock signal, and such that when the phase difference between the reference clock signal and the feedback clock signal is at most the threshold value, the second charge pump circuit outputs an output current according to the control signal in addition to the output current outputted by the first charge pump circuit.

4. The PLL circuit according to claim 2, wherein the control signal is a signal having a pulse length corresponding to the phase difference between the reference clock signal and the feedback clock signal, wherein when the control signal is activated, both the first charge pump circuit and the second charge pump circuit respectively output the output currents until a first period elapses after the activation of the control signal, and only the first charge pump circuit outputs the output current after the elapse of the first period from the activation of the control signal.

5. The PLL circuit according to claim 4, further comprising a signal processing circuit for receiving the control signal to limit the pulse length of the control signal to at most a constant length, and outputting the control signal with the limited pulse length to the second charge pump circuit.

6. The PLL circuit according to claim 5, wherein the signal processing circuit is a high-pass filter.

7. The PLL circuit according to claim 2, wherein according to the control signal, switching is performed between the state in which both the first charge pump circuit and the second charge pump circuit are operated, and the state in which only the first charge pump circuit is operated.

8. The PLL circuit according to claim 1, wherein the amount of output current of the second charge pump circuit per unit amount of the phase difference between the reference clock signal and the feedback clock signal is larger than the amount of output current of the first charge pump circuit per unit amount of the phase difference.

9. The PLL circuit according to claim 1, wherein the charge pump circuit comprises;

two switches which are connected in series between a voltage source and a reference potential and are controlled based on the control signal; and a capacitor connected between the mutual connection point of the two switches and the reference potential, and wherein the mutual connection point of the two switches is connected at the output end of the charge pump circuit.

10. The PLL circuit according to claim 1, wherein the charge pump circuit comprises:

a first series circuit configured by connecting in series a current source and a switch controlled based on the control signal; and a second series circuit which is different from the first series circuit and is configured by connecting in series a current source and a switch controlled based on the control signal, wherein the mutual connection point of the first series circuit and the second series circuit is connected at the output end of the charge pump circuit, wherein in the first series circuit, the switch is connected to a voltage source, and the current source is connected to the output end, and wherein in the second series circuit, the switch is connected to the reference potential, and the current source is connected to the output end.

\* \* \* \* \*